United States Patent [19]

McGinn

[11] 4,374,366
[45] Feb. 15, 1983

[54] INTEGRATED HORIZONTAL OSCILLATOR EMPLOYING AN ON-CHIP CAPACITOR FOR USE IN A TELEVISION RECEIVER

[75] Inventor: Michael McGinn, Tempe, Ariz.

[73] Assignee: Motorola, Inc., Schaumburg, Ill.

[21] Appl. No.: 220,606

[22] Filed: Dec. 29, 1980

[51] Int. Cl.³ .............................................. H03K 4/50
[52] U.S. Cl. ................................ 331/111; 331/108 C; 358/159
[58] Field of Search ............... 331/111, 108 C, 108 D, 331/113 R, 143, 144, 145; 358/150, 159

[56] References Cited

U.S. PATENT DOCUMENTS

| | | | |
|---|---|---|---|
| 4,035,744 | 7/1977 | Fukaya et al. ...................... | 331/111 |
| 4,155,049 | 5/1979 | Kitazawa et al. ................ | 358/159 X |
| 4,292,605 | 9/1981 | Rodgers ............................. | 331/111 |

*Primary Examiner*—Siegfried H. Grimm
*Assistant Examiner*—Edward P. Westin
*Attorney, Agent, or Firm*—Vincent B. Ingrassia

[57] ABSTRACT

A horizontal oscillator for a television receiver includes an on chip nitride capacitor. The circuit includes a reference current amplifier which generates a low temperature coefficient reference current. By varying the gain of a current mirror circuit, the reference current is split to produce a small charge/discharge current. A resistive bias chain and first and second capacitors are employed to fix the upper and lower peak voltages of the oscillator output ramp signal.

9 Claims, 5 Drawing Figures

- PRIOR ART -

INTEGRATED HORIZONTAL OSCILLATOR EMPLOYING AN ON-CHIP CAPACITOR FOR USE IN A TELEVISION RECEIVER

CROSS REFERENCE TO RELATED APPLICATIONS

1. U.S. application Ser. No. 220,604 entitled "Horizontal Phase Detector Gain Control"
2. U.S. application Ser. No. 220,608 entitled "Horizontal Phase Lock Loop For Television"
3. U.S. application Ser. No. 220,328 entitled "Linear Full Wave Rectifier and Method for Providing Full Wave Rectified Signals"
4. U.S. application Ser. No. 220,607 entitled "Large Scale, Single Chip Integrated Circuit Television Receiver Subsystem"
5. U.S. application Ser. No. 220,609 entitled "Variable Capacitance Circuit"
6. U.S. application Ser. No. 220,605 entitled "Crossover Circuit for Use in Automatic Gain Control Systems"
7. U.S. application Ser. No. 220,329 entitled "Linear Full Wave Rectifier Circuit"
8. U.S. application Ser. No. 220,611 entitled "Sync Separator"
9. U.S. application Ser. No. 220,610 entitled "Vertical Sync Counter Having Multi Modes of Operation For Different TV Systems"
10. U.S. application Ser. No. 220,614 entitled "Integrator Circuit For Separating Vertical Sync Pulses"

BACKGROUND OF THE INVENTION

1. Field of the Invention

This invention relates generally to oscillators and, more particularly, to a horizontal oscillator which utilizes an on chip capacitor for use in television receiver systems.

2. Description of the Prior Art

Typical black and white television receivers utilize a horizontal oscillator which generates an asymmetrical ramp signal at a frequency of 15.75 KHz which is the line frequency in the United States. These typical oscillators employ an expensive external capacitor (in the order of 10 nanofarads) and generate a charge/discharge current of approximately 1 milliamp which is derived from a reference current generated by the circuit. With the trend toward single chip television receivers, it would be desirable to integrate the oscillator capacitor on the integrated circuit chip. However, current state of the art integration techniques do not permit integration of capacitors which are larger than approximately 100 picofarads. Utilizing this smaller capacitor would require that the charge/discharge current be reduced to 5 to 10 microamps in order to maintain the oscillator frequency. However, conventional RC oscillators which attempt to define these low currents tend to be variable due to loading effects.

SUMMARY OF THE INVENTION

It is an object of the present invention to provide an integrated RC oscillator circuit which utilizes an on chip capacitor.

It is a further object of the present invention to provide a low current high stability constant charge/discharge RC oscillator which includes a current reference amplifier and a current splitting integrator so as to enable the reference current to be much larger than the actual charge/discharge current thus reducing oscillator loading effects and minimizing the size of the required capacitor.

It is still a further object of the present invention to provide horizontal oscillator for use in a TV system which enjoys low current operation to reduce power consumption while at the same time maintains oscillator output accuracy.

According to a broad aspect of the invention there is provided a horizontal oscillator for use in a television receiver, comprising: a capacitor having a first terminal coupled to a reference voltage and a second terminal coupled to an output node; first circuit means coupled to said output node for supplying a first current to said capacitor to charge said capacitor in a first mode of operation and for pulling a second current from said capacitor in a second mode of operation; comparison means coupled to said output node for detecting when the voltage across said capacitor has increased to a first potential and has decreased to a second potential; and second circuit means coupled to said first circuit means and to said comparison means for placing said first circuit means in said first mode when the voltage across said capacitor has decreased to said second potential and for placing said first circuit means in said second mode when the voltage across said capacitor has increased to said first potential.

According to a further aspect of the invention there is provided a single integrated circuit chip horizontal oscillator circuit, comprising: an on-chip capacitor having a first terminal coupled to a reference voltage and a second terminal coupled to an output node; first circuit means coupled to said output node for supplying a first current to said capacitor to charge said capacitor in a first mode of operation and for pulling a second current from said capacitor in a second mode of operation; comparison means coupled to said output node for detecting when the voltage across said capacitor has increased to a first potential and has decreased to a second potential; second circuit means coupled to said first circuit means and to said comparison means for placing said first circuit means in said first mode when the voltage across said capacitor has decreased to said second potential and for placing said first circuit means in said second mode when the voltage across said capacitor has increased to said first potential.

According to still a further aspect of the invention there is provided in a single integrated circuit chip television receiver, a horizontal oscillator circuit for generating a ramp signal, comprising: an on-chip capacitor having a first terminal coupled to a reference voltage and a second terminal coupled to an output node, said ramp signal appearing at said output node; first circuit means coupled to said output node for supplying a first current to said capacitor to charge said capacitor in a first mode of operation to produce an up portion of said ramp signal and for pulling a second current from said capacitor in a second mode of operation to produce a down portion of said ramp signal; comparison means coupled to said output node for detecting when the voltage across said capacitor has increased to a first potential corresponding to an upper peak of said ramp signal and has decreased to a second potential corresponding to a lower peak of said ramp signal; and second circuit means coupled to said first circuit means and to said comparison means for placing said first conduit means in said first mode when the voltage across said capacitor has decreased to said second peak and for placing said first circuit means in said second mode when the voltage across said capacitor has increased to said first peak.

The above and other objects, features and advantages of the present invention will be more clearly understood from the following detailed description taken in conjunction with the accompanying drawings, in which:

DESCRIPTION OF THE PREFERRED EMBODIMENT

Before embarking on a detailed discussion of the invention, it may be helpful to briefly review basic television principles. A complete TV picture appears on the TV screen thirty times per second. Between each picture, there is an interval during which the screen is dark. Each TV frame, however, is not projected as a complete picture but is created in sections by varying the brightness of a moving spot of light. That is, the picture tube contains an electron gun which generates an electron beam which moves very rapidly across a phosphor coated screen and, by changing its strength, different amounts of light are produced in different places. More exactly, the electron beam is focussed into a fine point that moves from the upper left-hand corner in a straight horizontal line to the right side of the screen. After each movement from left to right, the beam intensity is reduced so that no light is produced during the return motion from right to left. After each line is painted, the beam is moved down a little on the tube face. While the motion of the electron beam is called "scanning", the electronic actions involved are generally referred to a "sweeping" and we speak of a horizontal sweep frequency of approximately 15,750 cycles per second.

It should be obvious that there must be some synchronization between the image seen by a remote television camera and that which is ultimately shown on the TV screen. If, for example, the receiver scans a picture in more or less than on-thirtieth of a second, the picture will appear to roll vertically. Thus, great care is taken to synchronize accurately the scanning of each line and frame. To achieve this, synchronizing signals are transmitted to the receiver with the sound and video information. In addition to providing signals which control the starting of each line, the edges of the picture must be blanked out to avoid any appearance of ragged edges, and the electron beam must turned off during the time in which it returns to its starting place. This return time is often referred to as the retrace or flyback period and is approximately 9 microseconds long for each line (the horizontal flyback), but is considerably longer for the period when the beam returns from the bottom to the top of the screen (the vertical flyback period).

Figure 1:
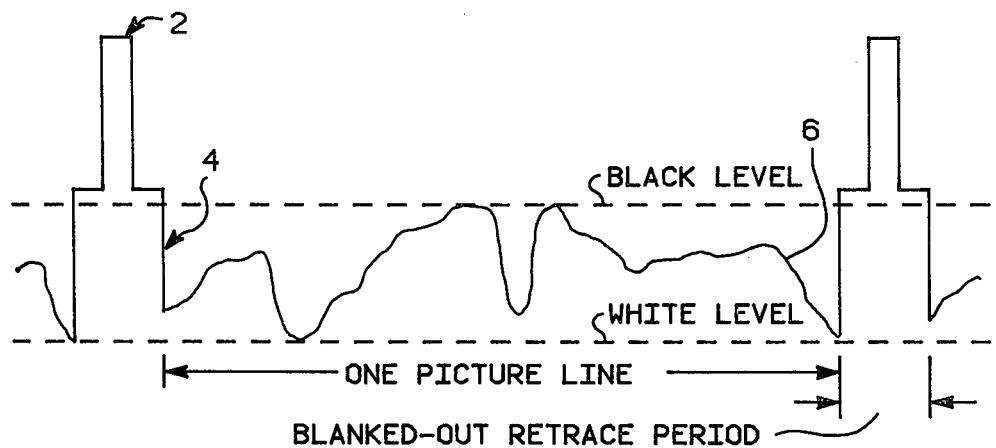
FIGS. 1 and 2 illustrate a composite video signal received by a television receiver.

FIG. 1 illustrates a black and white video signal including the horizontal synchronization pulses 2 and the horizontal blanking or flyback pulse 4. Interposed between successive flyback pulses is the actual black and white video signal 6 corresponding to one picture line.

As can be seen, the horizontal flyback pulse 4 extends into the black region so that the edges of the picture are completely black avoiding the appearance of ragged edges.

Figure 2:
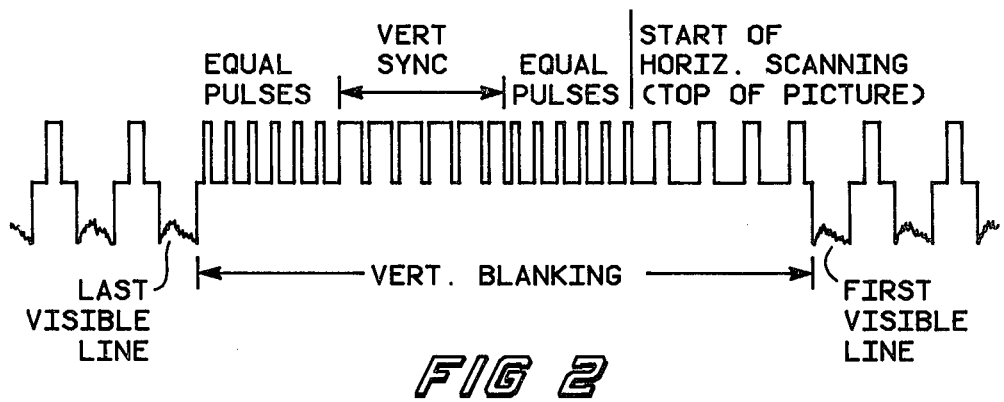

Referring to FIG. 2, the start of each field of vertical scanning is dictated by a vertical synchronization pulse which lasts much longer than the horizontal synchronization pulses. To avoid losing horizontal synchronization during the vertical flyback or blanking period, the horizontal synchronization pulses are superimposed on the vertical blanking pulse. The first six pulses are very narrow and are referred to as equalizing pulses. Next, there are periods of six wide pulses which comprise the actual vertical synchronization pulse serrated by the horizontal synchronization period. This is followed by an additional six equalizing pulses and then four regular horizontal synchronizing pulses that start the top of the picture. Note that the vertical blanking period extends through this time and darkens the screen while the beam moves from bottom to top and covers the first four lines of the picture.

Figure 3:
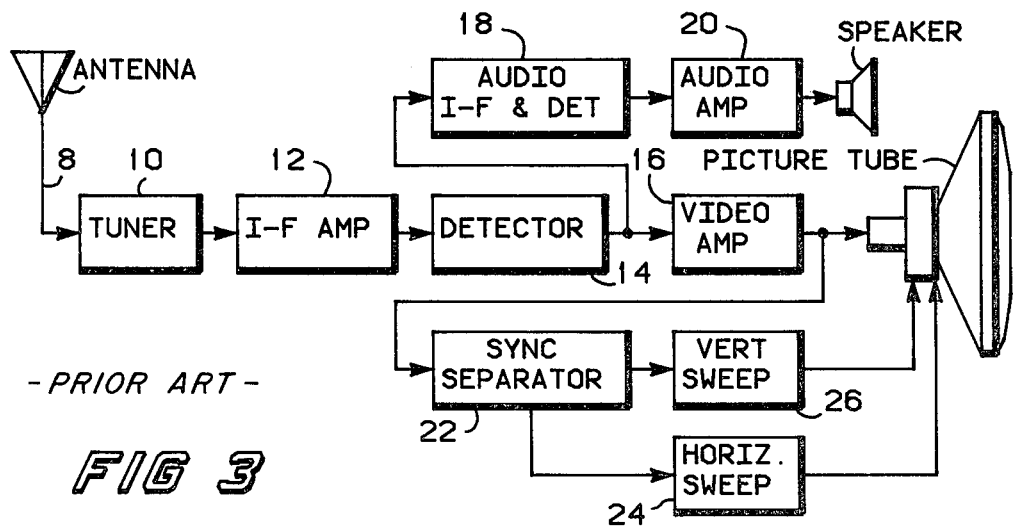
FIG. 3 is a block diagram of a basic prior art television receiver.

FIG. 3 is a block diagram of a basic black and white TV receiver. From the antenna, a transmission line 8 brings all signals received by the antenna to tuner 10 whose function it is to select the desired band of frequencies and reject all others. The tuner passes only the desired intermediate frequency to the IF amplifiers 12.

Television IF amplifiers 12 include a plurality of IF stages which amplify the IF signals. To prevent overloading and to minimize picture changes during fading, automatic gain control is used to control the amplification of the IF signal.

The output of IF amplifiers 12 is applied to a detector 14 which removes the amplitude modulated video signal and applies it to video amplifier 16. The sound signal is removed, amplified, clipped, and limited in audio section 18. The output of audio detector 18 is applied to audio amplifier 20 which is similar to audio amplifiers found in radio receivers. The output of the audio amplifier is applied to the speaker.

Video amplifier 16 requires more bandwidth than audio amplifier 20. This is accomplished using special peaking circuits for the high and low frequency response. The output of video amplifier 16 is applied to the picture tube and to a sync separator 22 which is unique to television receivers. As described earlier, the horizontal and vertical synchronization pulses appear on top of their respective blanking signals which are sandwiched in between lines of picture signal. The sync separator clips the synchronization pulses off the composite video signal after the signal has been amplified in video amplifier 16. Two separate filters may be employed to separate the vertical from the horizontal synchronization pulses. For example, a high pass filter would permit only the horizontal synchronization pulses to reach horizontal sweep section 24 while the vertical pulses could be passed through a low pass filter to the vertical sweep section 26.

The vertical sweep section generates the actual signals which pass through the deflection yoke of the picture tube to move the electron beam up and down. Similarly, the horizontal sweep section is responsible for moving the electron beam across the tube. In order to obtain the large current or short duration required in the horizontal deflection coils, a transformer is generally used. Furthermore, a flyback transformer is generally considered part of the horizontal sweep section. This transformer generates a high voltage during the time in which the electron beam returns from right to left.

Co-pending U.S. patent application Ser. No. SC-80979 entitled "Large Scale, Single Chip Integrated Circuit Television Receiver Subsystem" and filed of even date herewith describes a VLSI single chip television receiver the subject matter thereof is hereby incorporated by reference.

Figure 4:
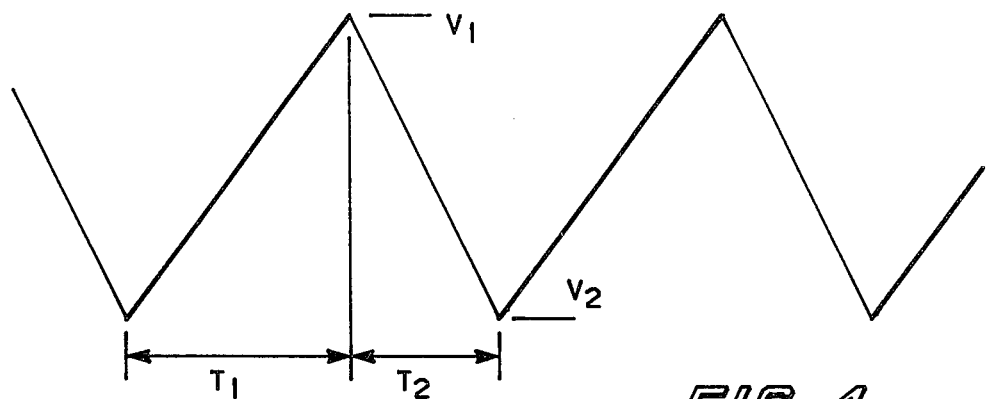
FIG. 4 illustrates in graphical form an asymmetrical ramp signal which must be generated by the horizontal oscillator in a television receiver system.

FIG. 4 illustrates the ramp signal generated by a horizontal oscillator in a television receiver. The signal has a ramp-up time ($T_1$) of approximately 20 microseconds and a ramp-down time ($T_2$) of approximately 12 microseconds. The upper and lower peak voltages are denoted $V_1$ and $V_2$ respectively.

Figure 5:
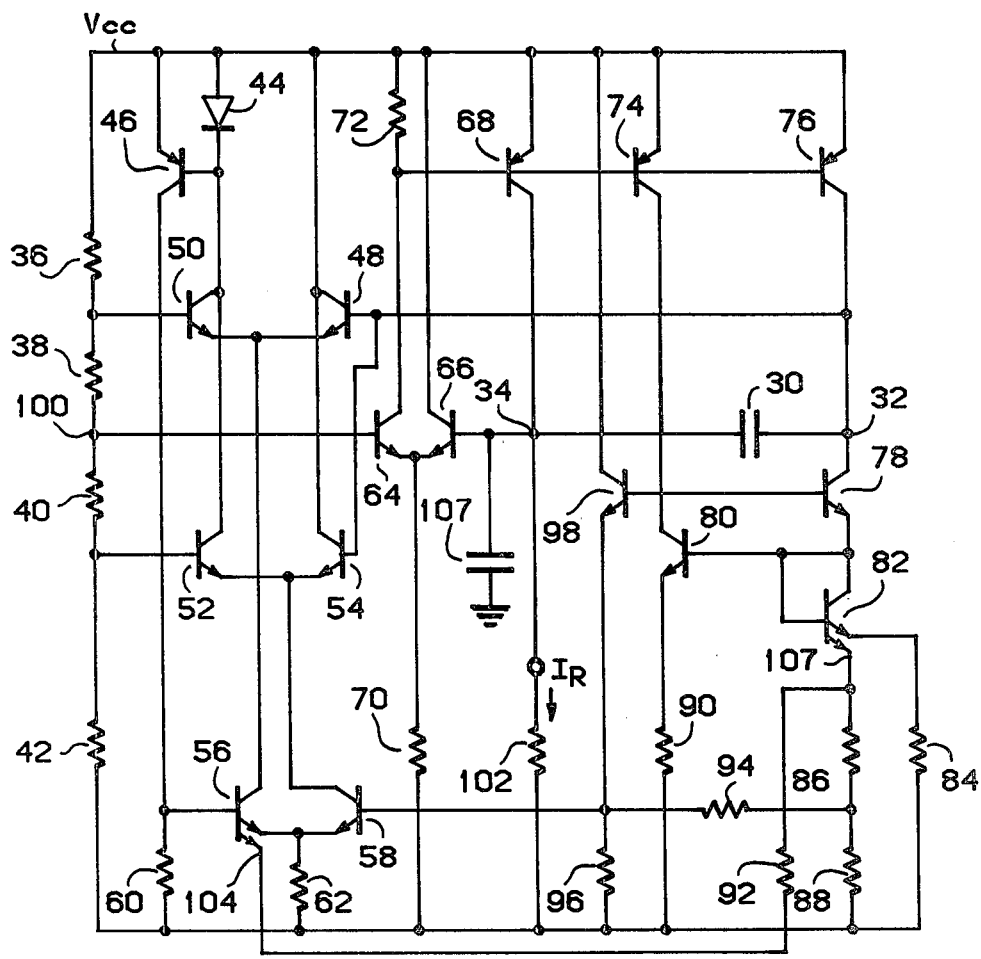
FIG. 5 is a schematic diagram of the inventive horizontal oscillator.

FIG. 5 is a schematic diagram of the inventive oscillator which includes an on-chip nitride capacitor 30 (approximately 50 picofarads) coupled between nodes 32 and 34. The circuit includes a bias chain comprised of resistors 36, 38, 40 and 42; a turn-around circuit comprised of diode 44 and transistor 46; a first comparator including transistors 48 and 50; a second comparator including transistors 52 and 54; a current source including transistors 56 and 58 and resistors 60 and 62; a reference amplifier including transistors 64, 66 and 68 and resistors 70 and 72; current mirror transistors 74 and 76; and a lower current mirror circuit including transistors 78, 80 and 82 and resistors 84, 86, 88, 90, 94, 96 and 92.

Transistor 64 has a base electrode coupled to a bias voltage at node 100. Thus, if transistors 64 and 66 are perfectly matched, an accurate reference voltage having a zero temperature coefficient will be produced at node 34. An accurate reference current ($I_R$) is then set up by virtue of resistor 102 which may be an external resistor to provide a degree of flexibility. The base of transistor 68 is coupled to the collector of transistor 64. Since transistors 68, 74 and 76 each have their base and emitter electrodes coupled together, the current produced at each of their collector electrodes will be equal (approximately 60 $\mu$a). Depending on the gain of the bottom current mirror circuit (transistors 78, 80 and 82), the current through transistor 78 will be either greater or less than the current through transistor 76. If greater, current (approximately 17 $\mu$a) will be pulled out of capacitor 30 to produce the down portion of the ramp. This condition exists when the gain of the bottom mirror circuit is high. If the gain is reduced, the current flowing through transistor 78 will be less than the current flowing through transistor 76 and the difference (approximately 10 $\mu$a) will flow into capacitor 30 to produce the up portion of the ramp.

The circuit shown in FIG. 5 operates as follows. If we assume that the voltage at node 32 is on the rising portion of the ramp between $V_1$ and $V_2$, transistor 50 will be on and transistor 48 will be off. With transistor 50 on, current will flow through diodes 44 and will be recreated at the collector of transistor 46 and thus at the base of transistor 56 turning transistor 56 on. Current will be supplied by emitter 104 to emitter 106 of transistor 82 to back bias it. This, in effect, removes resistors 86 and 88 from the lower current mirror circuit increasing its equivalent resistance and reducing its gain. Thus, less current will flow through transistor 78 causing a charging current (approximately 10 $\mu$a) to flow into capacitor 30. Transistors 78 and 98 are driven on by current supplied by current mirror transistor 74.

When the voltage at node 32 reaches $V_1$, transistors 48 and 54 begins to conduct and transistors 50 and 52 turn off. With transistor 50 off, transistor 56 turns off. Transistor 54 now takes all the current from transistor 58 and latches the loop. With transistor 56 off, emitter 106 of transistor 82 is no longer reverse biased and resistors 86 and 88 are back in the current path. This reduces the equivalent resistance of the lower current mirror circuit and increases its gain. Under these conditions, more current flows through transistor 78 than is supplied by transistor 76. Thus, the difference current (approximately 10 ma) is pulled out of capacitor 30 to produce the ramp-down portion of the oscillator signal and reducing the voltage at node 32.

When the voltage at node 32 reaches $V_2$, transistors 48, 54 and 58 turn off, transistors 50 and 56 turn on and the ramp-up process is repeated.

It should be noted that the stray capacitance 107 associated with capacitor 30 can be used to stabilize the reference amplifier. Further, transistor 98 provides temperature compensation for the nitride capacitor via resistor 94 since the voltage across resistor 94 will vary with temperature. Finally, it should be appreciated that the reference current produced by the reference amplifier (approximately 60 $\mu$a) is much larger than the actual charge-discharge current (approximately 10/17 $\mu$a) of the capacitor thus reducing oscillator loading effects and minimizing the value of the capacitor required. Through careful design and choice of currents, loading effects can be cancelled.

While the invention has been described with reference to a specific embodiment thereof, it will be understood that changes in form and details may be made by one skilled in the art without departing from the scope of the invention as defined by the appended claims.

I claim:

1. A horizontal oscillator for use in a television receiver, comprising:

a reference amplifier for generating a reference voltage;

a capacitor having a first terminal coupled to said reference voltage and a second terminal coupled to an output node;

first circuit means coupled to said reference amplifier for generating a referenced current;

second circuit means coupled to said output node for supplying a first current to said capacitor to charge said capacitor in a first mode of operation and for pulling a second current from said capacitor in a second mode of operation, said first and second currents being substantially smaller than said reference current, said second circuit means including a first current mirror circuit coupled to said reference amplifier, to said first circuit means to said output node for supplying said first current, and a second variable gain current mirror circuit coupled to said output node for pulling said second current;

comparison means coupled to said output node for detecting when the voltage across said capacitor has increased to a first potential and has decreased to a second potential; and third circuit means coupled to said second circuit means and to said comparison means for placing said second circuit means in said first mode when the voltage across said capacitor has decreased to said second potential and for placing said second circuit means in said second mode when the voltage across said capacitor has increased to said first potential.

2. A horizontal oscillator according to claim 1 wherein the impedance of said second variable gain current mirror circuit is altered by said third circuit means to vary its gain.

3. A horizontal oscillator according to claim 2 further including a bias chain coupled to a source of supply voltage for generating said first and second potentials.

4. A horizontal oscillator according to claim 3 wherein said comparison means comprises:
   a first comparator having a first input coupled to said potential on said bias chain, a second input coupled to said output node and an output coupled to said third circuit means; and
   a second comparator having a first input coupled to said second potential on said bias chain, a second input coupled to said output node and an output coupled to said third circuit means.

5. A single integrated circuit chip horizontal oscillator circuit, comprising:
   a reference amplifier for generating a reference voltage;
   an on-chip capacitor having a first terminal coupled to said reference voltage and a second terminal coupled to an output node;
   first circuit means coupled to said reference amplifier for generating a reference current;
   second circuit means coupled to said output node for supplying a first current to charge said capacitor in a first mode of operation and for pulling a second current from said capacitor in a second mode of operation, said first and second currents being substantially smaller than said reference current, said second circuit means including a first current mirror circuit coupled to said reference amplifier, to said first circuit means and to said output node for supplying said first current to said output node, and a second variable gain current mirror circuit coupled to said output node and to said reference amplifier for pulling said second current from said output node;
   comparison means coupled to said output node for detecting when the voltage across said capacitor has increased to a first potential and has decreased to a second potential; and
   third circuit means coupled to said second circuit means and to said comparison means for placing said second circuit means in said first mode when the voltage across said capacitor has decreased to said second potential and for placing said second circuit means in said second mode when the voltage across said capacitor has increased to said first potential.

6. A single chip oscillator circuit according to claim 5 wherein the impedance of said second variable gain current mirror circuit is altered by said third circuit means to vary its gain.

7. A single chip oscillator circuit according to claim 6 further including a bias chain for generating said first and second potentials.

8. In a single integrated circuit chip television receiver, a horizontal oscillator circuit for generating a ramp signal, comprising:
   a reference amplifier for generating a reference voltage;
   an on-chip capacitor having a first terminal coupled to said reference voltage and a second terminal coupled to an output node, said ramp signal appearing at said output node;
   first circuit means coupled to said reference amplifier for generating a reference current;
   second circuit means coupled to said output node for supplying a first current to said capacitor to charge said capacitor in a first mode of operation to produce an up portion of said ramp signal and for pulling a second current from said capacitor in a second mode of operation to produce a down portion of said ramp signal, said first and second currents being substantially smaller than said reference current, said second circuit means including a first current mirror circuit coupled to said reference amplifier, said first circuit means and to said output node for supplying said first current to said output node, and a second variable gain current mirror circuit coupled to said output node for pulling said second current;
   comparison means coupled to said output node for detecting when the voltage across said capacitor has increased to a first potential corresponding to an upper peak of said ramp signal and has decreased to a second potential corresponding to a lower peak of said ramp signal; and
   third circuit means coupled to said second circuit means and to said comparison means for placing said second circuit means in said first mode when the voltage across said capacitor has decreased to said lower peak and for placing said second circuit means in said second mode when the voltage across said capacitor has increased to said upper peak.

9. A horizontal oscillator circuit according to claim 8 further including a resistive bias chain for generating potentials corresponding to said upper and lower peaks.

* * * * *